US007034395B2

(12) United States Patent
Stolze

(10) Patent No.: US 7,034,395 B2
(45) Date of Patent: Apr. 25, 2006

(54) POWER SEMICONDUCTOR MODULE WITH COOLING ELEMENT AND PRESSING APPARATUS

(75) Inventor: Thilo Stolze, Arnsberg (DE)

(73) Assignee: Eupec Europaische Gesellschaft fur Leistungshalbleiter GmbH, Warstein (DE)

(*) Notice: Subject to any disclaimer, the term of this patent is extended or adjusted under 35 U.S.C. 154(b) by 20 days.

(21) Appl. No.: 10/821,728

(22) Filed: Apr. 9, 2004

(65) Prior Publication Data

US 2004/0217465 A1 Nov. 4, 2004

Related U.S. Application Data

(63) Continuation of application No. PCT/EP02/11179, filed on Oct. 4, 2002.

(30) Foreign Application Priority Data

Oct. 10, 2001 (DE) ................................ 101 49 886

(51) Int. Cl.
*H01L 23/34* (2006.01)
*H01L 23/495* (2006.01)

(52) U.S. Cl. ....................................... 257/718; 257/675

(58) Field of Classification Search ................ 257/675, 257/718
See application file for complete search history.

(56) References Cited

U.S. PATENT DOCUMENTS

| | | | | |
|---|---|---|---|---|
| 3,911,327 | A | 10/1975 | Murari et al. | 317/100 |
| 5,296,739 | A | 3/1994 | Heilbronner et al. | 257/687 |
| 5,808,868 | A | 9/1998 | Drekmeier | 361/704 |
| 6,507,108 | B1 | 1/2003 | Lindemann et al. | 257/724 |

FOREIGN PATENT DOCUMENTS

| | | | | |
|---|---|---|---|---|
| DE | 35 08 456 C2 | 1/1987 | | |
| DE | 40 01 554 A1 | 7/1991 | | |
| DE | 41 11 247 A1 | 10/1992 | | |
| DE | 41 11 247 C3 | 11/1996 | | |
| DE | 195 33 298 A1 | 3/1997 | | |
| DE | 199 42 770 A1 | 3/2001 | | |
| DE | 199 42 915 A1 | 3/2001 | | |
| EP | 0 254 692 A1 | 1/1988 | | |
| GB | 2 163 598 A | * | 2/1986 | 257/718 |
| GB | 2 167 228 A | 5/1986 | | |
| JP | 11330328 A | 11/1999 | | |
| WO | WO 03/021680 A2 | 3/2003 | | |

* cited by examiner

*Primary Examiner*—Howard Weiss
(74) *Attorney, Agent, or Firm*—Baker Botts L.L.P.

(57) ABSTRACT

A semiconductor power module (1) comprises at least a substrate (2) including at least a semiconductor element (6, 7, 8) and a pressing device (40) which acts on the substrate (2). The pressing device (40) enables to press the substrate (2), when mounted, on a cooling element (30) so as to evacuate from semiconductor components operational heat losses. The pressing device (40) consists of a housing (10) provided with at least an elastic deformation zone (16, 17, 15, 18, 19).

19 Claims, 2 Drawing Sheets

POWER SEMICONDUCTOR MODULE WITH COOLING ELEMENT AND PRESSING APPARATUS

CROSS REFERENCE TO RELATED APPLICATION

This application is a continuation of copending International Application No. PCT/EP02/11179 filed Oct. 4, 2002 which designates the United States, and claims priority to German application no. 101 49 886.1 filed Oct. 10, 2001.

TECHNICAL FIELD OF THE INVENTION

The present invention relates to a power semiconductor module for mounting on a cooling element, having at least one substrate on which one or more semiconductor components are located, and having a pressing apparatus, which acts on the substrate, in order to press the substrate against the cooling element when it is in the mounted state.

BACKGROUND OF THE INVENTION

In the case of a power semiconductor module such as this which is disclosed in DE 199 42 915 AI, two or more power semiconductors are arranged in a row on the upper face of an isolating and thermally conductive mount (substrate), and are connected to conductor tracks which run on the upper face of the substrate.

The lower face of the substrate is pressed against a heat sink by a pressing apparatus.

Power losses which occur in the form of heat during operation of the power semiconductor module are dissipated via the heat sink. For effective heat dissipation and a low thermal contact resistance, and hence reliable operation of the power semiconductor module, the heat sink must rest flat on the substrate lower face, without any gaps.

One problem in this case is the internal mechanical stresses on the module resulting from the different thermal coefficients of expansion of the different materials in the semiconductor module components (for example of the substrate and semiconductor material).

These stresses lead to undesirable deformation of the substrate and power semiconductor module lower face, so that a flat contact surface is no longer guaranteed. This results in intermediate spaces and air gaps, which adversely affect the heat transmission between the heat sink and the substrate. This problem becomes worse as the substrate size increases.

In order to solve this problem, it is conceivable to additionally provide a metal plate as a base plate, to whose upper face the substrate lower face, for example, is soldered. The intermediate solder layer would then compensate for shape discrepancies. The lower face of the base plate would be connected to the heat sink in order to provide a uniform heat distribution (as a so-called heat spreader) and to absorb mechanical stresses. However, this design increases the total costs of a power semiconductor module designed in this way, as a result of the additional base plate and its fitting.

It is also feasible to increase the contact forces by means of external brackets, such as those which are known in principle, for example, from DE 197 23 270 AI. However, if the substrate is severely loaded by high local contact pressures, there is a risk of the substrate fracturing. This risk increases as the substrate size increases. Furthermore, the use of additional brackets complicates the assembly process, and makes it more expensive.

SUMMARY OF THE INVENTION

The present invention is based on the object of providing a power semiconductor module which can be produced at low cost and which ensures good thermal contact with a cooling element or heat sink without any additional separate components.

According to the invention, for a power semiconductor module of the type mentioned initially, this object is achieved by the pressing apparatus being formed by a module housing with one or more resilient areas.

One major aspect of the present invention is the multifunctional use of a module housing. This means that there is no need for individual parts, which have to be manufactured, handled and installed separately, for pressing the substrate against the cooling element or against the heat sink. The housing allows both the fixing of the power semiconductor module on the heat sink and the production of a good thermal contact in a single assembly process.

A further major aspect of the present invention is that dimensional tolerances, in particular of the housing, are compensated for by the sprung elements or areas of the housing.

From a production engineering point of view, the resilient areas may preferably be integral material components of the housing for this purpose. These may advantageously be provided with their resilient characteristics by means of cut-outs and/or cross-sectional constrictions in the housing material. This is particularly advantageous when using housings which are composed of plastic and are produced, for example, using the plastic injection-molding method. Furthermore, an integral configuration of the module housing or housing part on the one hand and the spring element (in particular with a pressing stamp) on the other hand means that the module housing and housing part can be produced more easily and that the module can be assembled more easily, since no additional parts are required.

In comparison to the use of a separate contact bracket, the power semiconductor module according to the invention additionally has the advantage that a very homogeneous pressure force distribution can be achieved, instead of high pressures applied at specific points. For this purpose, one advantageous development of the power semiconductor module according to the invention provides for the pressing apparatus to act on the substrate at two or more points which are distributed uniformly over the substrate. For this purpose, the pressing apparatus may advantageously have pressing stamps which are connected to the resilient areas.

A further improvement in the reliability and the homogeneity of the mechanical contact between the substrate and the heat sink can be achieved according to one preferred refinement of the invention by the pressing apparatus acting circumferentially on the edge area of the substrate.

In one advantageous embodiment of the power semiconductor module according to the invention, the module housing has a first housing part and a second housing part, which applies a spring force to the first housing part.

The resilient areas may advantageously be formed by areas with recesses and/or cross-sectional constrictions in the module housing, and/or by spring elements which are integrally formed on the module housing (for example spring strips, spring edges, spring clips, etc.).

BRIEF DESCRIPTION OF THE DRAWING

Exemplary embodiments of the invention will be explained in more detail in the following text with reference to a drawing in which, schematically.

DESCRIPTION OF THE INVENTION

Figure 1:
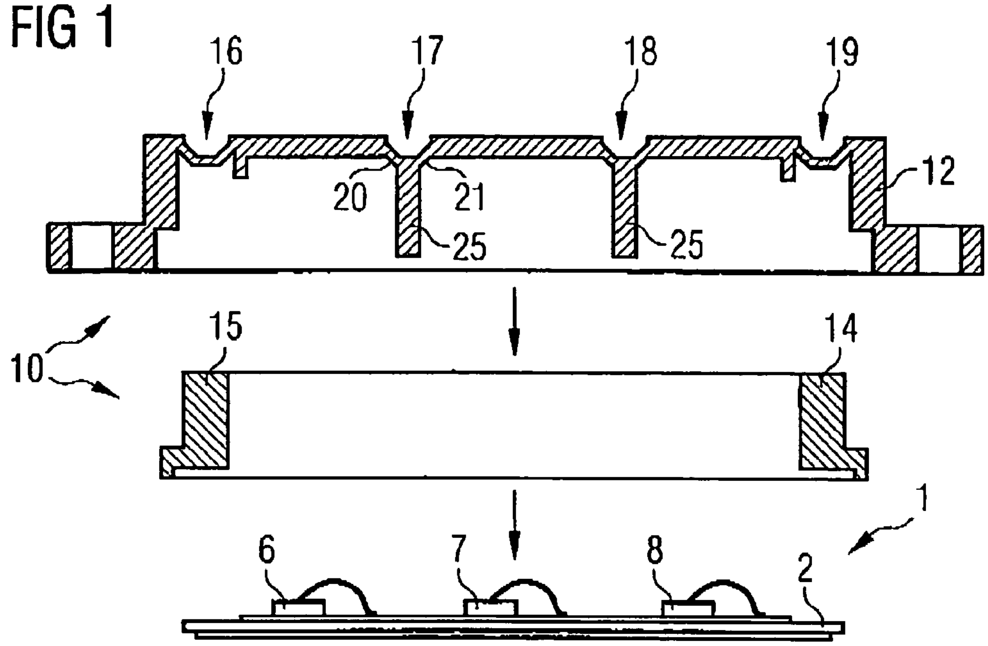
FIG. 1: shows components of a first exemplary embodiment of the power semiconductor module according to the invention, in the form of a cross section before assembly.

The power semiconductor module 1 as shown in FIG. 1 has, illustrated separately, a ceramic substrate (mount element) 2, on which two or more semiconductor components 6, 7 and 8 are arranged, with electrical contact being made with them. The semiconductor components are connected via bonding wires (which are indicated) to conductor tracks which are not illustrated in any more detail but are formed on the surface of the substrate 2. The conductor tracks lead, for example, to contact pins (connecting pins) for external connection of the power semiconductor module. The semiconductor components 6, 7 and 8 may be power semiconductors which develop large thermal losses, that are converted into heat, and therefore require effective heat dissipation.

Figure 2:
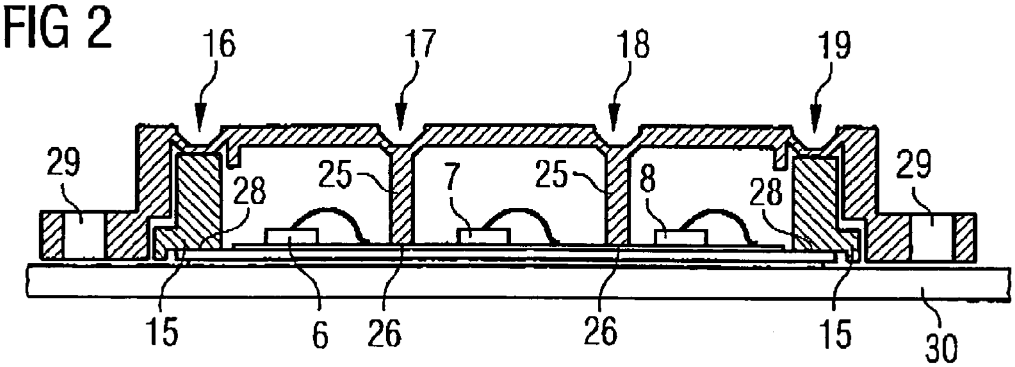
FIG. 2: shows the exemplary embodiment as in FIG. 1 in the assembled state.

The semiconductor module also has a module housing 10 which, in the exemplary embodiment, is formed from two housing parts 12 and 14. The module housing 10 is produced using the plastic injection-molding method. In the assembled state (as shown in FIG. 2), the housing part 12 clasps the housing part 14, which is provided with a circumferential collar 15. The housing part 12 has two or more resilient areas 16, 17, 18, 19, which are integrally formed from the module housing material. The resilient characteristics may be produced by providing material cut-outs in the region of the resilient areas. However, it is also possible to thin the material locally (for example in the areas 17 and 18), thus forming sprung elastic strips (for example 20, 21). These strips form the pivoting point or connecting point for a stamp 25, which is in the form of a web.

As is illustrated by the view of the power semiconductor module in the assembled state (the assembly procedure is indicated by arrows in FIG. 1) as shown in FIG. 2, the free end (foot point) 26 of the stamp acts on the upper face of the substrate 2. The resilient areas 16 and 19 act indirectly and circumferentially on the edge area 28 of the substrate 2, via the collar 15. In the assembled state, the module housing is screwed to a heat sink 30, which is illustrated only by way of indication, by means of mounting screws which are not shown but pass through holes 29.

Figure 3:
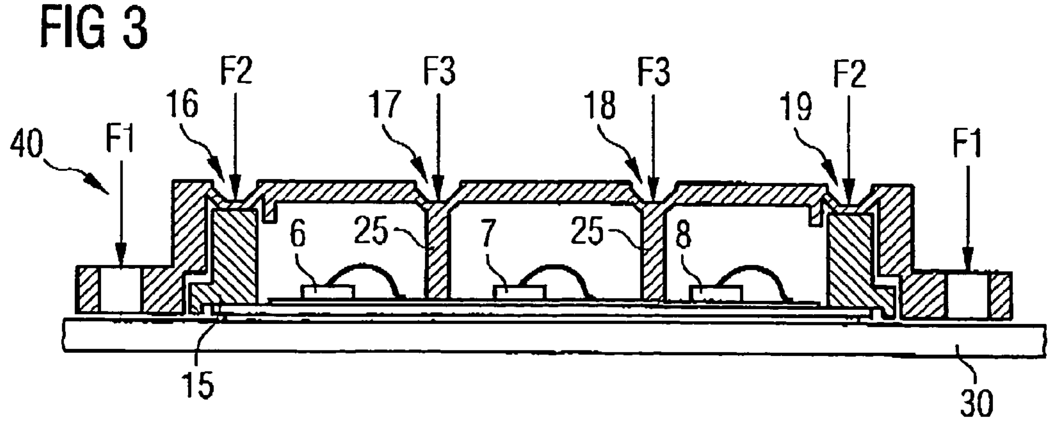
FIG. 3: shows the contact force distribution for the first exemplary embodiment of a pressing apparatus.

The screw forces which result from this are annotated F1 in FIG. 3. This screw connection deflects the resilient areas 16, 17, 18, 19 against their spring force so that their elastic behavior and their attempt to spring back to their original position result in them producing corresponding spring forces F2 and F3.

The spring forces are transmitted via the collar 15 (forces F2) and the stamps 25 (forces F3) to the substrate and ensure that the substrate makes a uniform contact with the heat sink 30, thus protecting the substrate. The module housing thus has two functions, acting not only as a housing for holding, protecting and sealing the semiconductor components 6, 7, 8, but also with its resilient areas 16, 17, 18, 19 acting as a pressing apparatus 40.

Figure 4:
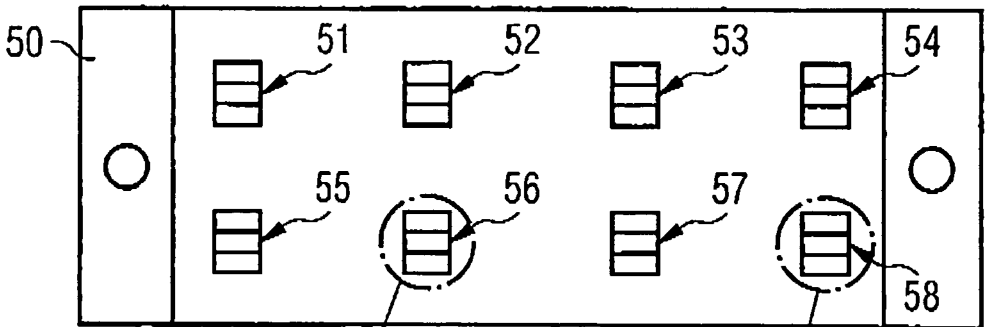
FIG. 4: shows a module housing part.

FIG. 4 shows a module housing part 50 with eight uniformly distributed resilient areas 51, 52, 53, 54, 55, 56, 57, 58. By way of example, the resilient areas 56 and 58 are illustrated greatly enlarged. The area 56 is in the form of a well, as a cut-out in the material or as a projection of the module housing part 50. One end 62 of a pressure stamp 64 is integrally formed at the lowest point in the well 60.

Figure 5:
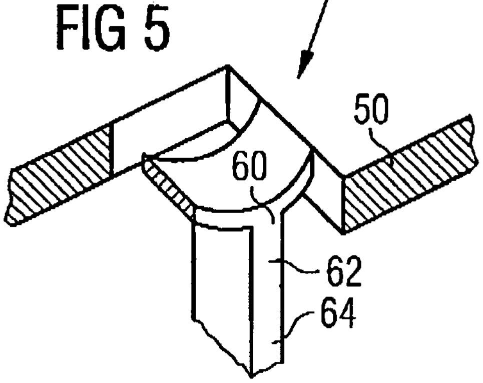
FIG. 5: shows, highly enlarged, a resilient area of the module housing as shown in FIG. 4, in detail.
Figure 6:
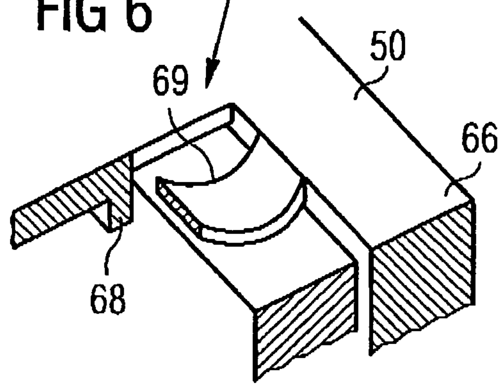
FIG. 6: shows, highly enlarged, a further resilient area of the module housing as shown in FIG. 4, in detail.

As can be seen from FIG. 5, the area 58 between one side wall 66 of the module housing part 50 and a holding web 68 is likewise designed as a spring element in the form of a well, by appropriate material reduction as a spring strip 69.

Figure 7:
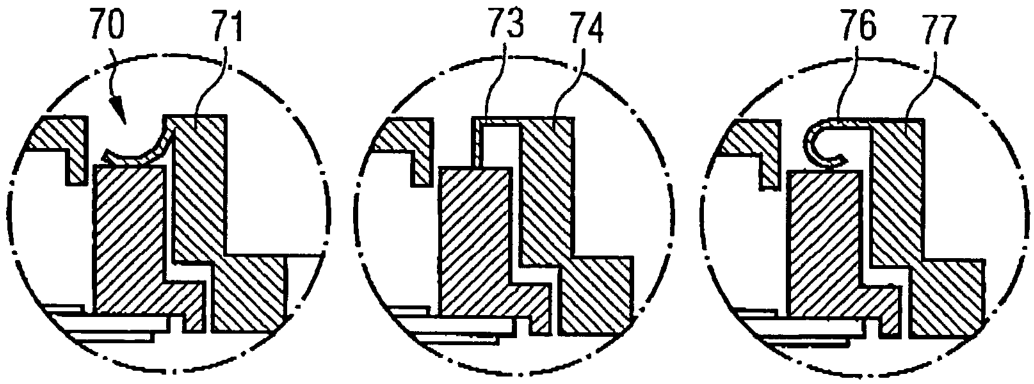
FIG. 7: shows variants of resilient areas, illustrated in a highly enlarged form.

FIG. 7 shows further variants of resilient areas, illustrated greatly enlarged. The actual sprung elements 70 may have a curved shape and may be integrally formed on only one wall or one holding web 71 of the housing or of a housing part. They may also be in the form of a spring clip 73 and may be integrally formed on only one wall or one holding web 74 of the housing or of a housing part.

The sprung element 76 may also be in the form of a rolled-up strip and may be integrally formed on a wall or a holding web 77 of the housing or a housing part.

All of these designs provide as the significant aspect according to the invention for the module housing to have resilient characteristics at distributed, defined points, acting deliberately on the substrate and pressing it against the heat sink in a protective manner. This advantageously also makes it possible to compensate for dimensional tolerances which would otherwise lead to severe inhomogeneous mechanical stresses being exerted on the substrate if the housing structure were stiff.

I claim:

1. A power semiconductor module for mounting on a cooling element, comprising at least one substrate on which one or more semi-conductor components are located, and a pressing apparatus, which acts on the substrate, in order to press the substrate against the cooling element when it is in the mounted state, with the pressing apparatus being formed by a module housing having one or more resilient areas, wherein the pressing apparatus comprises at least one pressing stamps extending from one of the resilient areas.

2. The power semiconductor module as claimed in claim 1, wherein the resilient areas are integral material components of the module housing.

3. The power semiconductor module as claimed in claim 1, wherein the pressing apparatus acts on the substrate at two or more points which are distributed uniformly over the substrate.

4. The power semiconductor module as claimed in claim 1, wherein the pressing apparatus acts circumferentially on the edge area of the substrate.

5. The power semiconductor module as claimed in claim 1, wherein the module housing has a first housing part and a second housing part, which applies a spring force to the first housing part.

6. The power semiconductor module as claimed in claim 1, wherein the resilient areas are formed by spring elements which are integrally formed on the module housing.

7. The power semiconductor module as claimed in claim 1, wherein the resilient areas are formed by areas with recesses in the module housing.

8. The power semiconductor module as claimed in claim 1, wherein the resilient areas are formed by areas with cross-sectional constrictions in the module housing.

9. A power semiconductor module comprising:

a cooling element;

a module housing mounted on said cooling element comprising resilient areas, and pressing stamps which extend from the resilient areas, and a substrate arranged on said cooling element comprising a semi-conductor component, wherein the pressing stamps exert a force on said substrate.

10. The power semiconductor module as claimed in claim 9, wherein the resilient areas are integral material components of the module housing and formed by a recess or cross sectional constriction.

11. The power semiconductor module as claimed in claim 9, wherein the pressing stamps act on the substrate at two or more points which are distributed uniformly over the substrate.

12. The power semiconductor module as claimed in claim 9, wherein the pressing stamps act circumferentially on the edge area of the substrate.

13. The power semiconductor module as claimed in claim 9, wherein the module housing has a first housing part and a second housing part, which applies a spring force to the first housing part.

14. The power semiconductor module as claimed in claim 9, wherein the resilient areas are formed by spring elements which are integrally formed on the module housing.

15. A power semiconductor module comprising:

a cooling element;

a module housing comprising a first housing part and a second housing part, which applies a spring force to the first housing part, mounted on said cooling element, said second housing part comprising resilient areas formed by areas with recesses or cross-sectional constrictions in the module housing, and pressing stamps extending from the resilient areas, and a substrate arranged on said cooling element comprising a semi-conductor component, wherein the first housing part and the pressing stamps exert a force on said substrate.

16. The power semiconductor module as claimed in claim 15, wherein the resilient areas are integral material components of the module housing.

17. The power semiconductor module as claimed in claim 15, wherein the pressing stamps act on the substrate at two or more points which are distributed uniformly over the substrate.

18. The power semiconductor module as claimed in claim 15, wherein the pressing stamps act circumferentially on the edge area of the substrate.

19. The power semiconductor module as claimed in claim 15, wherein the resilient areas are formed by spring elements which are integrally formed on the module housing.

* * * * *